(12) United States Patent
Wang et al.

(10) Patent No.: US 10,313,256 B2
(45) Date of Patent: Jun. 4, 2019

(54) APPARATUS AND METHODS FOR ADAPTIVE DATA COMPRESSION

(71) Applicant: Intel Corporation, Santa Clara, CA (US)

(72) Inventors: Ren Wang, Portland, OR (US); Weishuang Zhao, Pittsburgh, PA (US); Alexander W. Min, Portland, OR (US); Michael P. Mesnier, Scappoose, OR (US); Richard Chuang, Taipei (TW); Tsung-Yuan C. Tai, Portland, OR (US); Scott D. Hahn, Portland, OR (US)

(73) Assignee: Intel Corporation, Santa Clara, CA (US)

(*) Notice: Subject to any disclaimer, the term of this patent is extended or adjusted under 35 U.S.C. 154(b) by 437 days.

(21) Appl. No.: 14/718,938

(22) Filed: May 21, 2015

(65) Prior Publication Data

US 2016/0344646 A1   Nov. 24, 2016

(51) Int. Cl.
*H04L 12/811* (2013.01)
*H04L 12/813* (2013.01)
(Continued)

(52) U.S. Cl.
CPC ............ *H04L 47/38* (2013.01); *G06N 5/003* (2013.01); *G06N 7/005* (2013.01); *G06N 20/00* (2019.01);
(Continued)

(58) Field of Classification Search
CPC . H04L 43/0852; H04L 43/0894; H04L 69/04; H04L 65/607; H04L 67/2828;
(Continued)

(56) References Cited

U.S. PATENT DOCUMENTS 5,623,935 A     4/1997  Faisandier
5,805,932 A *   9/1998  Kawashima ............ H03M 7/48
                                                          360/48
(Continued)

FOREIGN PATENT DOCUMENTS

EP          2237561 A2     10/2010
EP          2637033 A1      9/2013
WO      WO 01-63772 A1     8/2001

OTHER PUBLICATIONS

International Search Report and Written Opinion dated Jul. 8, 2016 for International Application No. PCT/US2016/027532, 13 pages.
(Continued)

*Primary Examiner* — Philip J Chea
*Assistant Examiner* — Wuji Chen
(74) *Attorney, Agent, or Firm* — Schwabe, Williamson & Wyatt, P.C.

(57) ABSTRACT

Embodiments of apparatuses and methods for adaptive data compression and associated contextual information are described. In various embodiments, an apparatus may include a context monitoring module to gather contextual information for transmission of data and a policy module to gather user preference on cost associated with transmission of data. The apparatus may further include an analysis module to determine whether to compress data prior to transmission, based at least in part on the contextual information and the user preference. Other embodiments may be described and/or claimed.

21 Claims, 7 Drawing Sheets

(51) Int. Cl.
*H04L 29/06* (2006.01)
*G06N 5/00* (2006.01)
*G06N 7/00* (2006.01)
*G06N 20/00* (2019.01)
*H04L 12/26* (2006.01)
*H04L 29/08* (2006.01)
*H03M 7/30* (2006.01)

(52) U.S. Cl.
CPC .............. *H04L 47/20* (2013.01); *H04L 69/04* (2013.01); *H03M 7/30* (2013.01); *H04L 43/0852* (2013.01); *H04L 43/0894* (2013.01); *H04L 67/306* (2013.01)

(58) Field of Classification Search
CPC ................. H04L 2209/30; H04L 47/38; H04L 29/08792; H04L 29/08783; H04L 29/0651; H04L 29/0604
See application file for complete search history.

(56) References Cited

U.S. PATENT DOCUMENTS

| | | | |
|---|---|---|---|
| 7,085,848 B2* | 8/2006 | Cabrera | H04L 29/06 709/203 |
| 7,228,350 B2* | 6/2007 | Hong | H04L 29/06 370/389 |
| 7,987,217 B2* | 7/2011 | Long | H04L 29/06 707/774 |
| 8,046,496 B1* | 10/2011 | Nucci | H04J 3/18 370/477 |
| 8,305,947 B2 | 11/2012 | Wang et al. | |
| 8,463,944 B2* | 6/2013 | Bansal | H03M 7/30 370/202 |
| 8,949,466 B1* | 2/2015 | Crosbie | H04W 4/70 709/247 |
| 9,166,862 B1* | 10/2015 | Davis | H04L 29/06047 |
| 9,543,980 B2* | 1/2017 | Huang | H03M 7/30 |
| 9,800,474 B1* | 10/2017 | Bush | H04L 41/32 |
| 2002/0035673 A1* | 3/2002 | Roseborough | G06F 17/3048 711/129 |
| 2002/0073232 A1* | 6/2002 | Hong | H04L 29/06 709/238 |
| 2002/0078174 A1* | 6/2002 | Sim | G06F 17/30194 709/219 |
| 2002/0198883 A1* | 12/2002 | Nishizawa | G06F 17/30902 |
| 2003/0064744 A1 | 4/2003 | Zhang et al. | |
| 2003/0191812 A1* | 10/2003 | Agarwalla | G06F 17/30902 709/217 |
| 2003/0198294 A1 | 10/2003 | Zaccarin | |
| 2003/0200197 A1* | 10/2003 | Long | H04L 29/06 |
| 2005/0080872 A1 | 4/2005 | Davis et al. | |
| 2006/0123199 A1* | 6/2006 | White | G06F 12/0815 711/141 |
| 2006/0212524 A1* | 9/2006 | Wu | H04L 67/1095 709/206 |
| 2006/0294125 A1* | 12/2006 | Deaven | H04N 19/46 |
| 2007/0096954 A1* | 5/2007 | Boldt | H03M 7/30 341/50 |
| 2007/0104113 A1* | 5/2007 | Mega | H04L 43/00 370/252 |
| 2008/0279462 A1 | 11/2008 | Celi, Jr. | |
| 2008/0310443 A1 | 12/2008 | Gage | |
| 2009/0046775 A1 | 2/2009 | Thiagarajan et al. | |
| 2009/0300167 A1* | 12/2009 | Jones | H04L 65/607 709/247 |
| 2010/0095064 A1* | 4/2010 | Aviles | H04L 67/1097 711/118 |
| 2010/0254621 A1 | 10/2010 | Wennersten et al. | |
| 2011/0022812 A1* | 1/2011 | van der Linden | G06F 9/5077 711/163 |
| 2011/0055360 A1 | 3/2011 | Jones et al. | |
| 2011/0199948 A1 | 8/2011 | Wang et al. | |
| 2011/0299412 A1 | 12/2011 | Diab et al. | |
| 2012/0023504 A1* | 1/2012 | Noam | H04L 65/00 718/105 |
| 2012/0324472 A1* | 12/2012 | Rossbach | G06F 9/467 718/106 |
| 2013/0036101 A1 | 2/2013 | Marwah et al. | |
| 2013/0144736 A1* | 6/2013 | Vodopia | G07G 1/0045 705/20 |
| 2013/0145010 A1* | 6/2013 | Luna | H04W 40/248 709/223 |
| 2013/0301430 A1* | 11/2013 | Pamu | H04L 69/04 370/252 |
| 2013/0325927 A1* | 12/2013 | Corbett | G06F 17/30442 709/203 |
| 2013/0336380 A1 | 12/2013 | Mese et al. | |
| 2014/0101485 A1* | 4/2014 | Wegener | H03M 7/3068 714/32 |
| 2014/0351229 A1* | 11/2014 | Gupta | G06F 17/30153 707/693 |
| 2014/0376405 A1 | 12/2014 | Erickson | |
| 2015/0019686 A1* | 1/2015 | Backholm | H04L 47/32 709/217 |
| 2015/0089052 A1 | 3/2015 | Lin et al. | |
| 2015/0215314 A1* | 7/2015 | Pisharody | H04L 63/0861 726/7 |
| 2015/0382235 A1* | 12/2015 | Min | H04W 28/06 370/230 |
| 2016/0127490 A1* | 5/2016 | Li | H04L 67/2828 709/247 |
| 2016/0134723 A1* | 5/2016 | Gupta | H04L 67/2828 709/247 |
| 2016/0314140 A1* | 10/2016 | Gupta | G06F 17/30153 |
| 2016/0371355 A1* | 12/2016 | Massari | G06F 17/30321 |

OTHER PUBLICATIONS

Final Office Action dated Oct. 6, 2016 from U.S. Appl. No. 14/316,653, 21 pages.
International Search Report and Written Opinion dated Aug. 31, 2015 for International Application No. PCT/US2015/032273, 11 pages.
Alexander W. Min et al., "Compression Configuration Identification", U.S. Appl. No. 14/316,653, Jun. 26, 2014, 49 pages.
F. Qian et al., "How to Reduce Smartphone Traffic Volume by 30%?" in Proc. of the 14th International Conference on Passive and Active Measurement (PAM), 2013, pp. 42-52.
Extended European Search Report dated Nov. 5, 2015 for European Application No. 15167651.7, 8 pages.
Office Action dated Feb. 4, 2016 for U.S. Appl. No. 14/316,653, 28 pages.
Office Action dated Aug. 1, 2017 for Canadian Patent Application No. 2,947,617, 5 pages.
Extended European Search Report dated Nov. 30, 2018 for European Patent Application No. 16796889.0, 12 pages.

* cited by examiner

APPARATUS AND METHODS FOR ADAPTIVE DATA COMPRESSION

FIELD OF THE INVENTION

The present disclosure relates generally to the technical field of computing, and more particularly, to apparatuses and methods for adaptive data compression.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

Data traffic to and from cloud servers has been increased rapidly in recent years, and such a trend may continue in the future. Such a trend for data explosion may introduce communication delays in user response time, and data traffic may consume a significant amount of platform energy. As an example, uploading files (e.g., photos or videos) to a cloud server is an important user case for cloud usage. However, users sometimes have to endure a long delay before completing an uploading transaction. Further, if the device is on a mobile network, uploading a large file may be costly based on the user's data plan.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
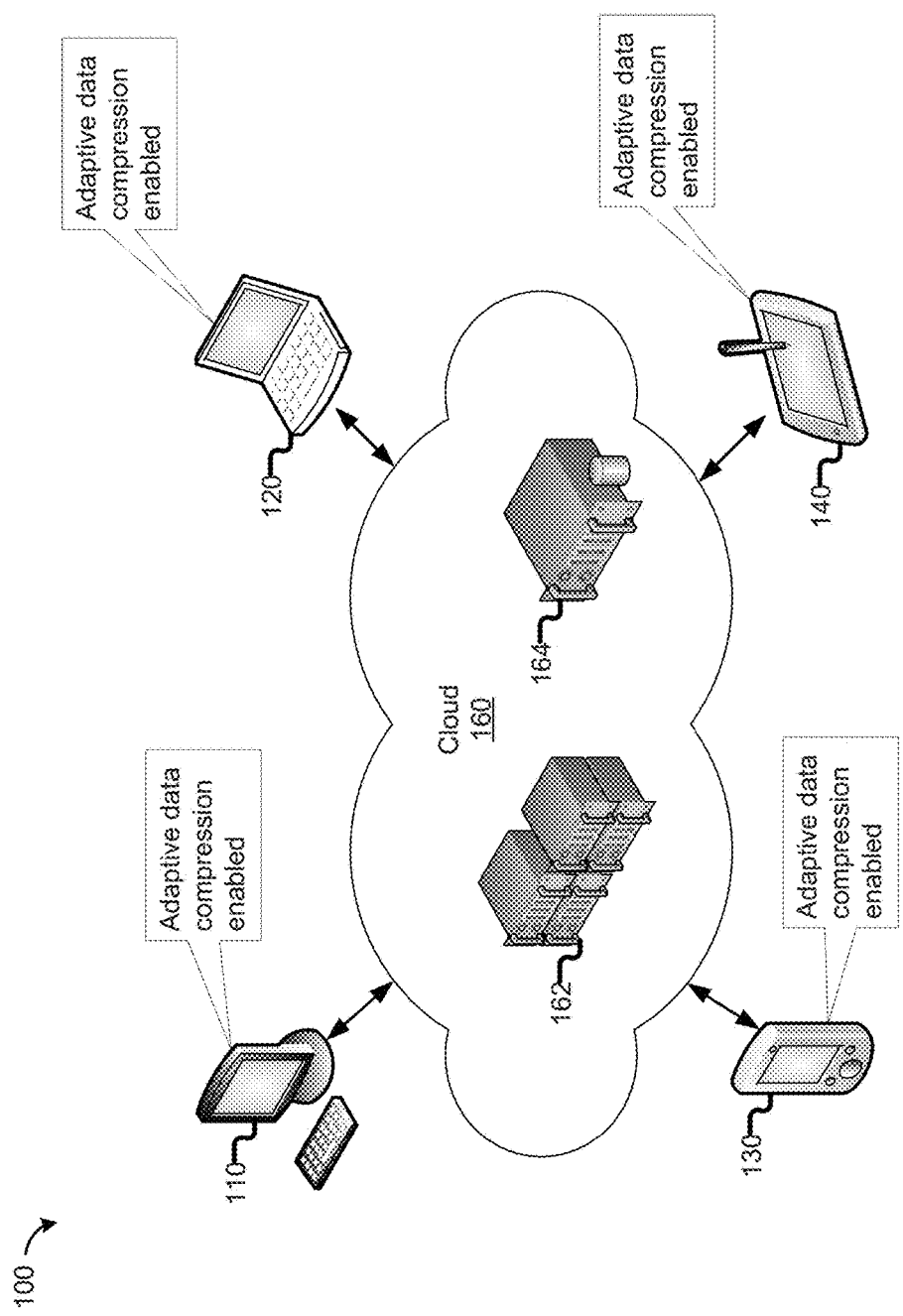
FIG. 1 is a schematic diagram illustrating an example system configuration for adaptive data compression, incorporating aspects of the present disclosure, in accordance with various embodiments.

Embodiments of apparatuses and methods for adaptive data compression based on contextual information and user preference are described. In various embodiments, an apparatus may include a context monitoring module to gather contextual information for transmission of data and a policy module to gather user preference on cost associated with transmission of data. The apparatus may further include an analysis module to determine whether to compress data prior to transmission, based at least in part on the contextual information and the user preference. Therefore, the apparatus may adaptively compress data to improve user experience, performance, and energy efficiency. These and other aspects of the present disclosure will be more fully described below.

In the following detailed description, reference is made to the accompanying drawings, which form a part hereof, wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

Reference in the description to one embodiment or an embodiment means that a particular feature, structure, or characteristic described in connection with the embodiment is included in at least one embodiment of the invention. The description may use the phrases "in one embodiment," "in an embodiment," "in another embodiment," "in various embodiments," or the like, which may each refer to one or more of the same or different embodiments. Furthermore, the terms "comprising," "including," "having," and the like, as used with respect to embodiments of the present disclosure, are synonymous.

In various embodiments, the term "module" may refer to, be part of, or include an application specific integrated circuit (ASIC), an electronic circuit, a processor (shared, dedicated, or group), and/or memory (shared, dedicated, or group) that execute one or more software or firmware programs, a combinational logic circuit, and/or other suitable components that provide the described functionality. In various embodiments, a module may be implemented in firmware, hardware, software, or any combination of firmware, hardware, and software.

In various embodiments, for the purposes of the present disclosure, the phrase "context" or "contextual information" means any information that can be used to characterize the data to be transmitted or the network used to transmit the data.

Referring now to FIG. 1, an example system configuration for adaptive data compression, in accordance with various embodiments, is illustrated. System 100 may include various user devices of one or more users, which may have direct or indirect access via networking to service devices in system 100. As illustrated in FIG. 1, user devices may include, e.g., desktop computer 110, mobile computer 120, smartphone 130, or tablet computer 140.

While not illustrated, user devices in system 100 may also include a handheld computer, a laptop, a cellular phone, a pager, an audio and/or video player (e.g., an MP3 player, a DVD player, etc.), a gaming device, a video camera, a digital camera, a navigation device (e.g., a GPS device), a wireless peripheral (e.g., a headset, etc.), and/or other suitable user electronic devices, which may communicate with cloud 160 and be enhanced with the teachings of the present disclosure.

User devices may be configured to wirelessly connect to server devices in computing cloud 160 (hereinafter, cloud 160), such as server 162 and data server 164. As will be described in more detail below, user devices and service devices may be respectively incorporated with corresponding teachings of the present disclosure to enable a user device to adaptively compress data before sending data to server devices or other user devices.

In various embodiments, user devices in system 100 may be configured to communicate with cloud 160, a computing infrastructure complex. Cloud 160 may support cloud computing, which generally refers to an adequately resourced computing model with resources, such as hardware, storage, management solutions, security solutions, business applications, etc., available as services via networking. Cloud 160 may generally offer its services as infrastructure as a service (IaaS), platform as a service (PaaS), software as a service (SaaS), network as a service (NaaS), and/or communication as a service (CaaS). Moreover, cloud 160 may specifically offer services, based on one or more service types, such as IaaS, PaaS, SaaS, NaaS, and/or CaaS, supporting a user device to adaptively compress a file before uploading the file to cloud 160. Thus, such services may be delivered economically to improve user experience, performance, and energy efficiency.

In various embodiments, cloud 160 may include one or more server devices, for example, server 162 and/or data server 164, hereinafter, collectively referred to as "cloud server," incorporated with the teachings of the present disclosure, to cooperatively enable a user device to perform adaptive data compression. In various embodiments, server 162 may be application servers, which may perform application related logic. In various embodiments, data server 164 may be configured to provide data services.

In various embodiments, cloud 160 may include one or more wireless and/or wired networks to operatively couple the user devices to the cloud server. The networks may include public and/or private networks, such as, but not limited to, the Internet, a telephone network (e.g., public switched telephone network (PSTN)), a local area network (LAN), a wide area network (WAN), a cable network, an Ethernet network, and so forth. In various embodiments, user devices may be coupled to these networks via a cellular network and/or a wireless connection. Wireless communication networks may include various combinations of wireless personal area networks (WPANs), wireless local-area networks (WLANs), wireless metropolitan area networks (WMANs), and/or wireless wide area networks (WWANs).

Data may be compressed before uploading or downloading from a user device's perspective. Generally, the decompression process is very inexpensive compared to the compression process. Thus, it may be always beneficial for a user device to receive compressed files from server devices and quickly decompress them locally because it may reduce latency, energy, and potentially cost (e.g., when on a paid mobile network).

However, for uploading a file from a user device to a server device, data compression may not necessarily improve user experience. As one example, the total time for compression and transmission of a file may be longer than simply transmitting the file without compression. For uploading usages, there may be many parameters impacting the decision whether to compress a file, including file size, file type, compression algorithm, and device capabilities including processor frequency, to name a few, as well as other transmission related parameters, including the type of wireless technologies used (e.g., Wi-Fi or 2G/3G/4G), available transmission bandwidth, and other parameters. A user device in system 100, e.g., smartphone 130, may take into consideration the impacting factors discussed herein, and makes a real-time decision on whether to compress a file before uploading it to cloud 160 or another user device in a peer-to-peer manner. These and other aspects of adaptive data compression will be more fully described below.

In some embodiments, the decision for adaptive data compression may be made by a client device locally. In some embodiments, the decision for adaptive data compression may be made by a server device on cloud 160. In some embodiments, the decision for adaptive data compression may be implemented in an accelerator or mediator (not shown), which may be responsible for cloud communications between a user device and a server device.

Figure 2:
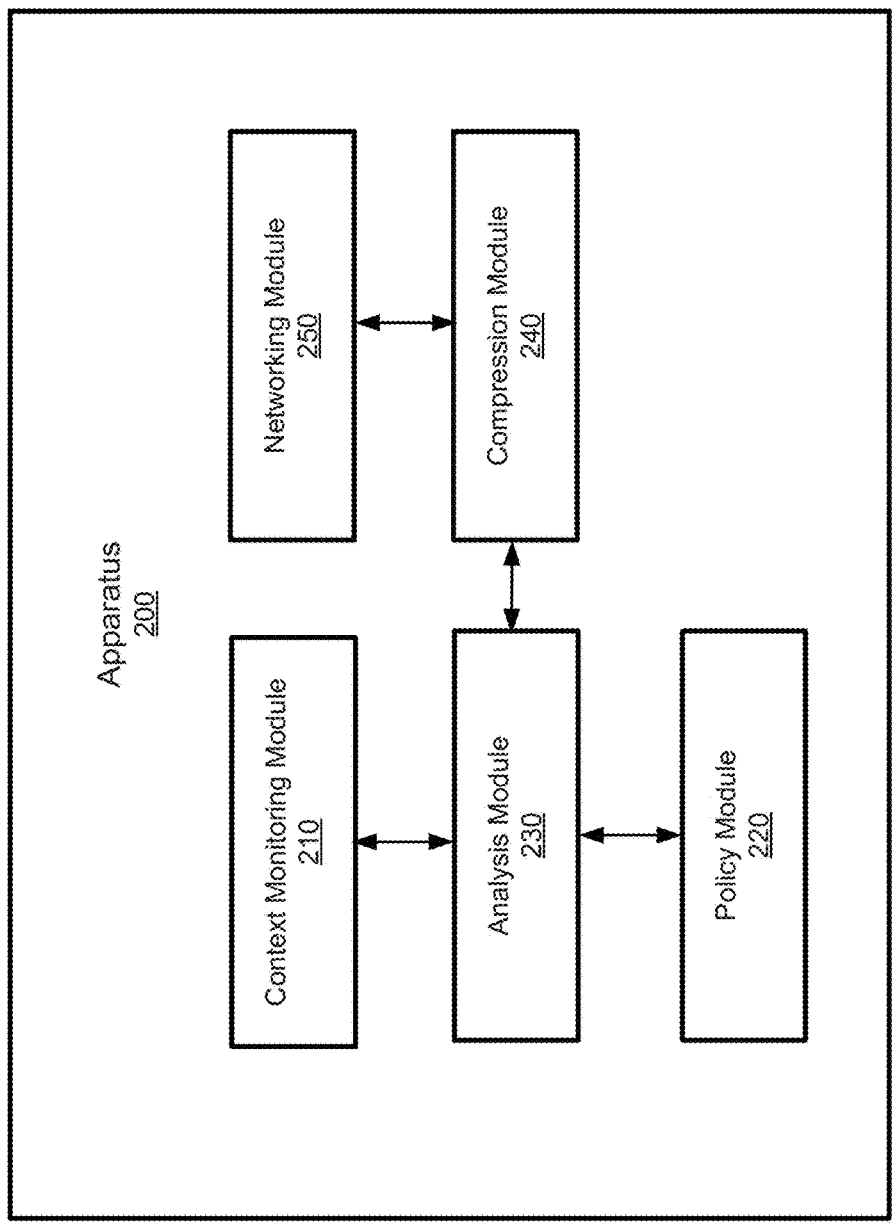
FIG. 2 is a schematic diagram illustrating an example implementation of an apparatus for adaptive data compression, incorporating aspects of the present disclosure, in accordance with various embodiments.

Referring now to FIG. 2, an example implementation of an apparatus 200 for adaptive data compression, in accordance with various embodiments, is illustrated. In various embodiments, apparatus 200 may be a computing device, such as laptop 120 or smartphone 130 in FIG. 1. Apparatus 200 may utilize network information, file information, user preference, etc., to adaptively compress a file before transmitting the file to another computing device. In various embodiments, apparatus 200 may include context monitoring module 210, policy module 220, analysis module 230, compression module 240, and networking module 250, operatively coupled with each other.

Apparatus 200 may include context monitoring module 210 to collect file information and related contextual information for the file transmission. For example, context monitoring module 210 may gather the contextual information of at least one of the device type of apparatus 200, the network bandwidth, the network latency, or the file size to be transmitted. Device type may impact how fast compression can be performed. As an example, a full-fledged desktop computer 110 may perform the same compression algorithm much faster than smartphone 130 in FIG. 1. Available network bandwidth may impact the transmission time of a file. As an example, greater bandwidth may yield faster transmission. In some embodiments, available network bandwidth may be obtained using heuristic information. Network latency may also impact the transmission time of a file. Although the average latency (e.g., at one location) to a certain cloud server may be relatively stable, the network latency may change when the location changes. Thus, context monitoring module 210 may track the location information and heuristically adjust the expectation of the network latency. File type and file size may impact the compression algorithms and the compression time. As an example, the cost, in terms of processor time, per byte for compression is not the same for different file sizes.

In various embodiments, policy module 220 may gather a user's preference on the file transmission. As an example, some users may pursue robust performance, e.g., the fastest total time for transmitting the file. As another example, some users may be more cost-aware, e.g., prefer the most economical method for transmitting the file in a paid network. Such user preference, e.g., performance vs. cost, may be an important factor for determining whether to compress a file before its transmission. In various embodiments, policy module 220 may gather the user preference of at least one of a performance-centric policy, a cost-centric policy, or a policy that balances both performance and cost. Such user preference may be determined based on per user device, per network, per networking session, per file type, per file size, per cloud server, per application, per file uploading, or other criteria defined by the user or the system.

In some embodiments, a user may prefer a performance-centric policy, in which the total upload time is the primary consideration. Thus, the total time for uploading with compression may be compared with the total time for uploading without compression, and the operation with less time may be selected. In some embodiments, a user may prefer a cost-centric policy. Here, apparatus 200 may verify whether the user device is on a paid network. Compression may be always applied to compressible files regardless of the total uploading time, so that the cost for uploading may be minimized. In some embodiments, a user may prefer a balanced policy, in which both the monetary cost factor and uploading time may be considered for the decision for compression.

In various embodiments, if a user prioritizes performance or energy-saving, apparatus 200 may then perform adaptive data compression to achieve the shortest total uploading time. On the other hand, if a user prefers saving cost, e.g., on a paid network, apparatus 200 may then perform adaptive data compression to optimize the total network traffic regardless of the uploading time. In various embodiments, apparatus 200 may take a user's preference into consideration, but the final decision for adaptive data compression may be different from the user's preference, e.g., according to the overall system design to optimize uploading time for all applications in a user device.

In various embodiments, analysis module 230 may be configured and used by apparatus 200 to determine whether to compress a file prior to its transmission, based at least in part on the contextual information gathered from context monitoring module 210 and the user preference gathered from policy module 220. Once a decision for compression is made, analysis module 230 may further determine a data compression algorithm to compress the file in some embodiments. However, in other embodiments, compression module 240 may determine the actual compression algorithm or process.

In various embodiments, analysis module 230 may need to determine the total time for transmitting a file without further compression and the total time for compressing the same file and transmitting it based at least in part on the contextual information of such transmission. In some embodiments, analysis module 230 may construct a lookup table offline using a machine learning process based on various impact factors of the contextual information and training datasets. Thus, analysis module 230 may quickly look up the estimated total time for transmitting a file with or without further compression. In other embodiments, analysis module 230 may also compute the estimated total time for transmitting a file with or without further compression at real-time before the actual transmission.

To build up such lookup table offline, analysis module 230 may experiment with different parameters, such as device types, network bandwidths, file sizes, and network latencies, and measure the total uploading time for both compression and non-compression cases. It is usually impossible to profile every possible uploading case, and offline datasets may be used as the training set, e.g., for a machine learning algorithm, to predict the total time (compression or non-compression) in a new uploading case.

Analysis module 230 may use various technologies to predict the outcome of a new uploading case, e.g., using computational statistics, machine learning, or any other suitable techniques for prediction-making In one embodiment, analysis module 230 may use those impact factors discussed herein in a random forest regression (RFR) machine learning process. RFR as a machine learning algorithm may be used to predict the total time for compression cases and non-compression cases for given scenarios. RFR is a meta estimator that fits a number of decision tree classifiers on various sub-samples of the dataset and uses averaging to improve the predictive accuracy and control over-fitting. As an example, profiling datasets for both compression and non-compression operations may be fed into the RFR algorithm. Then, the RFR algorithm may predict the total time for either case in a given scenario.

Although machine learning processes may be executed in real-time to estimate the total time for both compression and non-compression operations, to avoid such real-time machine learning overhead, a lookup table using an offline learning process may be constructed by analysis module 230. The table may include the impact factors, and the predicted total time for compression and non-compression operations. Thus, during real-time operations, analysis module 230 may perform a quick lookup to obtain the predicted time for transmission. Accordingly, analysis module 230 may determine whether compression may be applied to a file based on the total time with compression and non-compression along with user preference as discussed herein.

In various embodiments, compression module 240, coupled to the analysis module 230, may perform the compression algorithm when a decision is made to compress the file before its transmission. With data compression, the same file may be encoded with fewer bits than its original uncompressed representation. However, different file types may need to be compressed with different compression algorithms. As an example, video compression may be different from text compression. Even for the same file type, data compression is still subject to a space-time complexity trade-off. As an example, an image may be compressed with either lossy or lossless algorithms. No information is lost in lossless compression, as it only reduces bits by identifying and eliminating statistical redundancy. On the other hand, lossy compression may substantially reduce the size of the image by removing unnecessary information, but potentially causes image quality reduction as the trade-off. Thus, compression module 240 may determine the data compression schemes based on various factors, including the file type, the file size, the degree of compression, the amount of distortion introduced, the computational resources required for compression, the current consumption status of computational resources, etc. In other embodiments, specific data compression decisions may be already made by analysis module 230.

In those cases, compression module 240 may simply execute the data compression process accordingly.

In various embodiments, networking module 250 may provide an interface for apparatus 200 to upload data to another computing device (e.g., a cloud server or another user device). In various embodiments, networking module 250 in apparatus 200 may utilize one or more wireless or wired networks to communicate with other devices. These wireless or wired networks may include public and/or private networks, such as, but not limited to, LANs, WANs, or the Internet. In some embodiments, these wireless networks may include one or more WPANs, WLANs, WMANs, or WWANs. In some embodiments, these wireless networks may include cellular networks, for example, Wideband Code Division Multiple Access (WCDMA), Global System for Mobile Communications (GSM), Long Term Evolution (LTE), and the like.

In various embodiments, apparatus 200 may be implemented differently as depicted in FIG. 2. As an example, context monitoring module 210 may be combined with policy module 220 to form a comprehensive module to gather related information for data communication. In various embodiments, components depicted in FIG. 2 may have a direct or indirect connection not shown in FIG. 2. As an example, analysis module 230 may be directly connected to networking module 250 as well as compression module 240. In other embodiments, some of the modules may be divided into multiple modules.

In various embodiments, some or all components of apparatus 200 may be spread across any number of different devices or networks. Some or all components of apparatus 200 may be local or remote to the user. As an example, analysis module 230 may be implemented as an integrated subsystem of a cloud server (e.g., server 162 of FIG. 1) rather than located in a user device. In this case, the server may receive an indication from a user device for transmitting a file to the server. Accordingly, the server may gather relevant impact factors for such transmission, e.g., the duration for transmitting the file from the user device to the server or the user preference for performance or cost. In this case, the server may construct the lookup table for the uploading time estimation. Therefore, the server may quickly determine whether the user device should compress the file before transmitting the file from the client to the server based at least in part on these impact factors and the user preference. Then, the server may send such decision to the user device.

Figure 3:
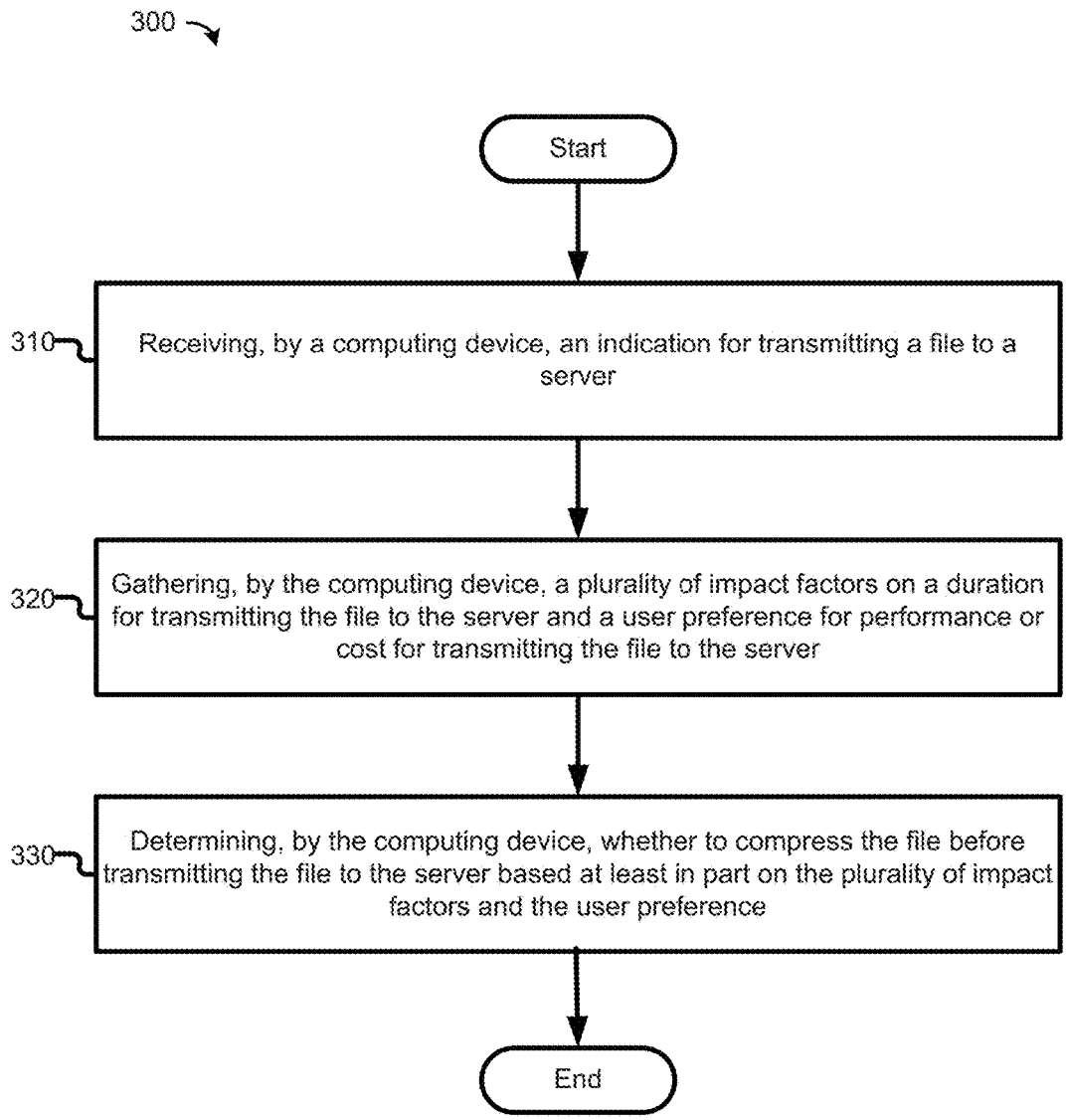
FIG. 3 is a flow diagram of an example process for adaptive data compression, which may be practiced by an example apparatus, incorporating aspects of the present disclosure, in accordance with various embodiments.

Referring now to FIG. 3, it is a flow diagram of an example process 300 for adaptive data compression that may be practiced by an example apparatus incorporating aspects of the present disclosure, in accordance with various embodiments. Process 300 may be performed by processing logic that comprises hardware (e.g., circuitry, dedicated logic, programmable logic, microcode, etc.), software (e.g., instructions run on a processing device to perform hardware simulation), or a combination thereof. The processing logic may be configured to provide adaptive data compression. As such, process 300 may be performed by a computing device, e.g., apparatus 200, to implement one or more embodiments of the present disclosure. In various embodiments, process 300 may have fewer or additional operations, or perform some of the operations in different orders.

In various embodiments, the process may begin at block 310, where an indication for transmitting a file to a server may be received by a user device, e.g., by apparatus 200 of FIG. 2. In some embodiments, such indication may be triggered by specific events in a user device. As an example, a cloud storage application or app on a user device may detect a new photo, which may in turn trigger the request to synchronize the local photo with a related cloud server. In some embodiments, such indications may be specifically generated by a user. As an example, a user may specifically command uploading a file from a user device to a cloud server.

Next, at block 320, a plurality of impact factors on a duration for transmitting the file to the server and a user preference for performance or cost for transmitting the file to the server may be gathered, e.g., by context monitoring module 210 and/or policy module 220 of FIG. 2. As discussed herein, context monitoring module 210 may gather the contextual information of at least one of the device types of apparatus 200, the network bandwidth, the network latency, the file type, the file size, etc. In various embodiments, the gathering of the context information may be performed continuously or periodically (but frequently), prior to receiving an indication to transmit a file. Meanwhile, policy module 220 may gather the user preference of at least one of a performance-centric policy, a cost-centric policy, or a policy that balances both performance and cost. Further, policy module 220 may gather the respective weights to be assigned to the performance and cost factors in a balanced policy. Likewise, in various embodiments, gathering of user preferences may be performed continuously or periodically, prior to receiving an indication to transmit a file and/or gathering of context information.

Next, at block 330, it may be determined whether to compress the file before transmitting the file to the server based at least in part on gathered information of impact factors and the user preferences, e.g., by analysis module 230 of FIG. 2. In various embodiments, analysis module 230 may look up the predicted total time for transmission with or without compression from a lookup table. In some embodiments, this lookup table may be built offline with training datasets, e.g., based on a suitable machine learning process. In various embodiments, analysis module 230 may make such determination based at least in part on the user preference for reducing a total time for transmitting the file or a total monetary cost for transmitting the file. In some embodiments, analysis module 230 may take the system performance into consideration in addition to the user preference. As an example, when a network is congested, all user devices may default to the data compression mode to mitigate the congestion. In various embodiments, process 300 may improve the overall performance, energy, and user experience with adaptive data compression as described herein.

Figure 4:
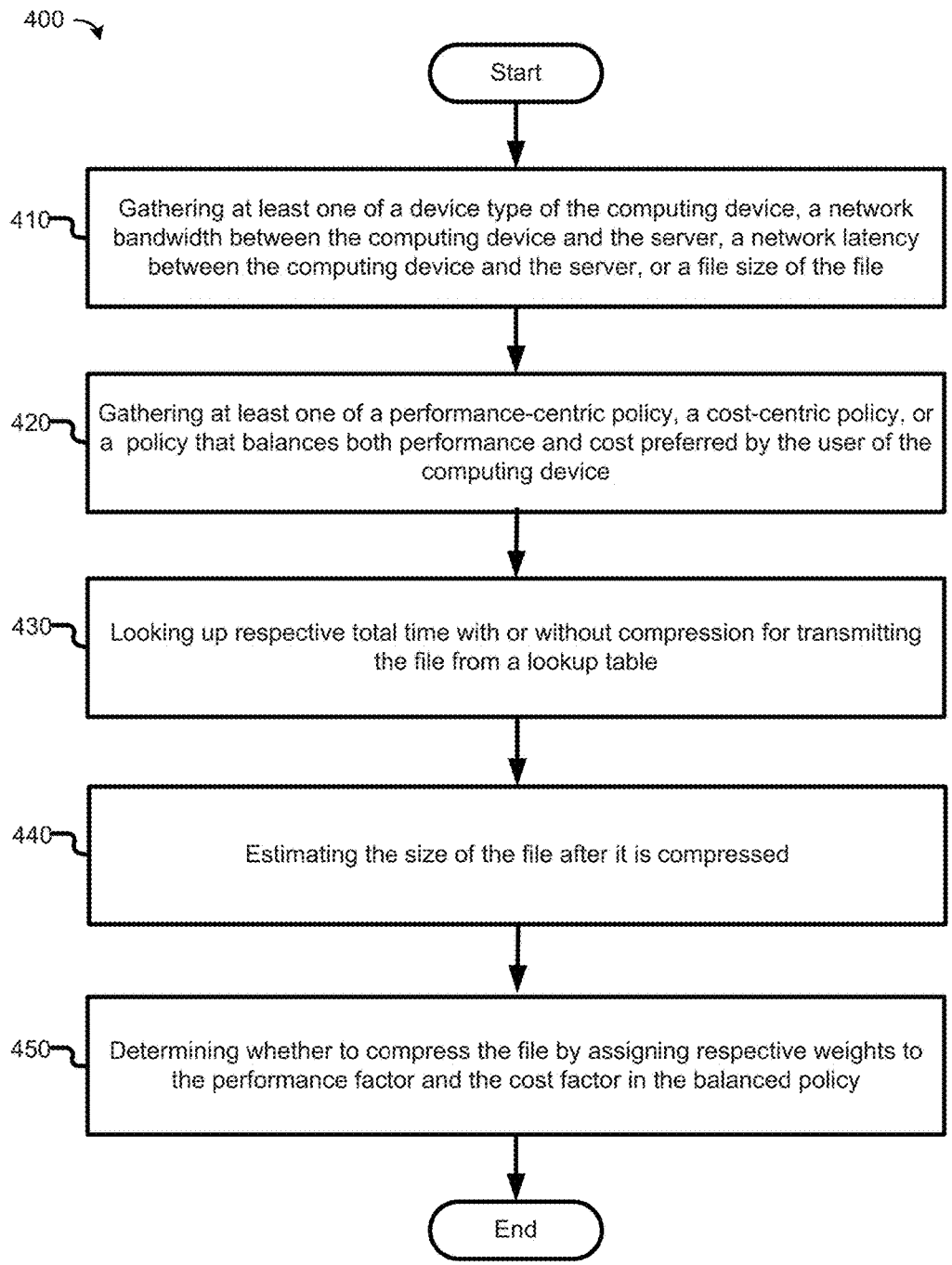
FIG. 4 is a flow diagram of an example process for adaptive data compression based on a balanced policy, which may be practiced by an example apparatus, incorporating aspects of the present disclosure, in accordance with various embodiments.

Referring now to FIG. 4, it is a flow diagram of an example process for adaptive data compression based on a balanced policy, which may be practiced by an example apparatus in accordance with various embodiments. Process 400 may be performed by apparatus 200 to implement one or more embodiments of the present disclosure. In various embodiments, process 400 may be performed in reference to block 320 and block 330 in FIG. 3. In various embodiments, various blocks in FIG. 4 may be combined or arranged in any suitable order, e.g., according to the particular embodiment of apparatus 200 for adaptive data compression.

In various embodiments, the process may begin at block 410, where a computing device may gather contextual information for transmission, including at least one of a device type of the computing device, a network bandwidth between the computing device and the server, a network latency between the computing device and the server, or a file size of the file.

Next, at block 420, the computing device may further gather the user preference for transmission, such as at least one of a performance-centric policy, a cost-centric policy, or a policy that balances both performance and cost preferred by the user of the computing device.

Next, at block 430, the computing device may look up respective predicted total time for transmitting the file with or without further compression, e.g., from a lookup table. In some embodiments, the lookup table may be built offline based on some training datasets, e.g., in a machine learning process.

Next, at block 440, the computing device may further estimate the size of the file after it is compressed. In some embodiments, such estimation may also be obtained from a lookup table, e.g., based on the file type, the file size, and the selected data compression algorithm. In other embodiments, such estimation may be computed algorithmically in real-time, as the characteristics of most data compression algorithms are well-known.

Next, at block 450, the computing device may determine whether to compress the file by assigning respective weights to the performance factor and the cost factor in a balanced policy. With balanced policy, both the monetary cost factor and uploading time factor may be considered for the final decision between uploading with or without data compression. In one embodiment, the following exemplary policy equation may be used for adaptive data compression.

$$BP=\beta*((NCT-CT)/NCT)+(1-\beta)((OS-CS)/OS) \qquad \text{Eq. 1}$$

In Eq. 1, NCT is the total time to transmit the data without further compression, whereas CT is the total time for data compression and transmission. Thus, the component of ((NCT−CT)/NCT)) may denote the benefit of data compression in respect to time. If this component of time saving factor is negative, it means that data compression in this case may actually prolong the total uploading time, e.g., due to the prolonged time for data compression itself.

In Eq. 1, OS is the original file size without data compression, whereas CS is the file size after data compression. Thus, the component of ((OS-CS)/OS) may reflect the benefit of data compression in respect to network traffic reduction (thus financial cost in some cases). Theoretically, this component of cost saving factor should always yield a value between 0 and 1.

In Eq. 1, β is a configurable coefficient indicating respective weight given to the time saving factor or cost saving factor. In some embodiments, β may be a parameter configurable by a user. In some embodiments, β may be pre-determined by the system, e.g., based on the device type or the network type. In various embodiments, the final decision for adaptive data compression may be based on the value of BP. In one embodiment, the computing device may choose to perform data compression as long as the value of BP is positive or greater than a pre-determined threshold value.

Figure 5:
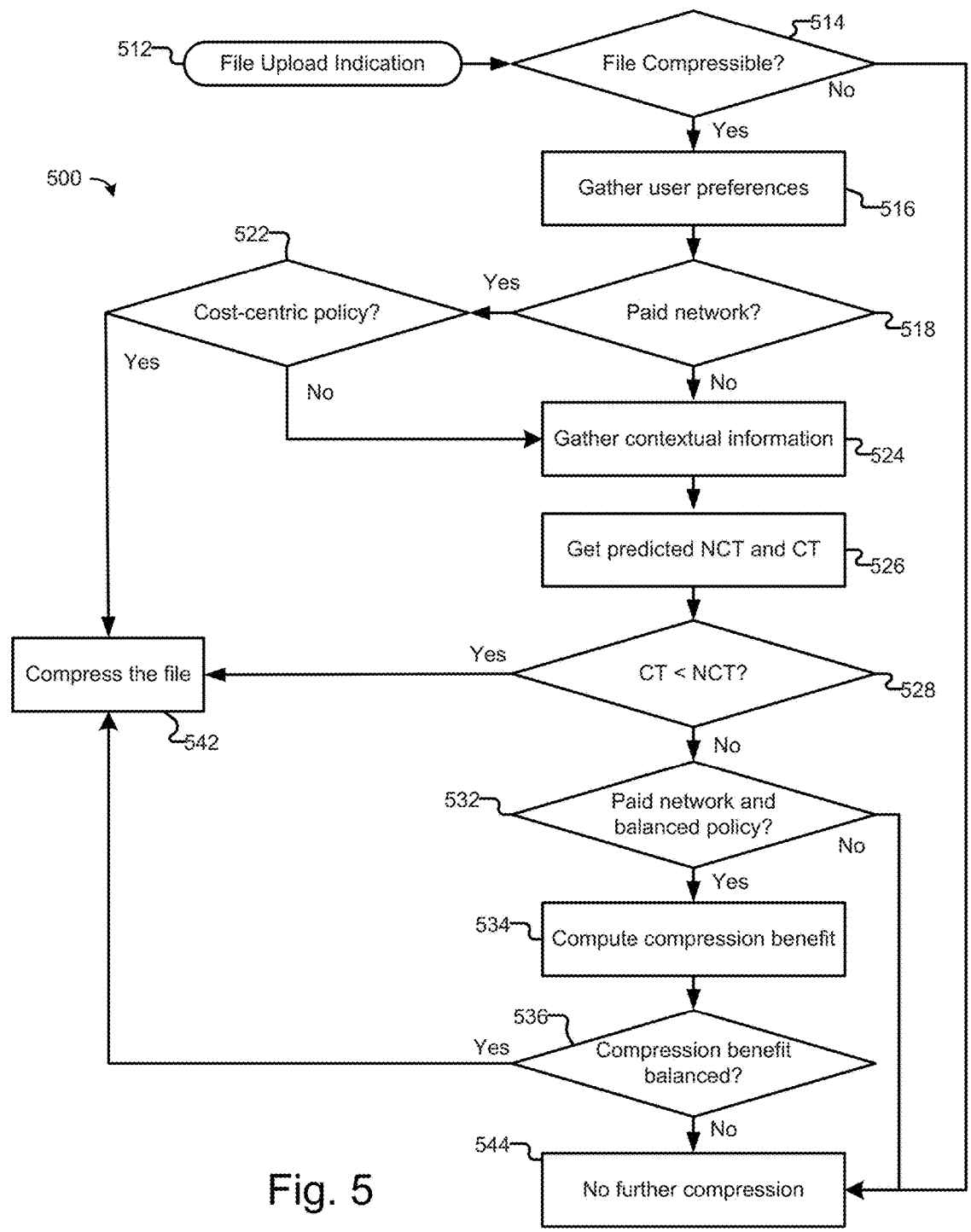
FIG. 5 is a flow diagram of an example process for adaptive data compression based on contextual information or user preference, which may be practiced by an example apparatus, incorporating aspects of the present disclosure, in accordance with various embodiments.

Referring now to FIG. 5, it is a flow diagram of an example process 500 for adaptive data compression based on contextual information or user preference. As shown, process 500 may be performed by apparatus 200 to implement one or more embodiments of the present disclosure. Similar to process 300 and 400, in various embodiments, process 500 may have fewer or additional operations, or perform some of the operations in different orders.

In various embodiments, process 500 may begin at block 512, where a file upload indication may be received by a user device. The user device may further evaluate whether the file is compressible at block 514. Many files are not compressible, e.g., because a file lacks repeating patterns, the file has already been compressed, the file has been encrypted, etc. In this case, a decision of no further compression may be made at block 544. However, if the file is compressible, the user preferences for uploading the file may be gathered at block 516. In some embodiments, the user preferences may be selected from one of a performance-centric policy, a cost-centric policy, or a policy that balances both performance and cost.

Process 500 may continue at block 518, where whether the present network is a paid network may be verified. In various embodiments, whether a network is paid or free is determined based on the present uploading session. As an example, many WiFi networks do not impose data limitations or only charge a one-time fee. Thus, a user may upload a file without being charged particularly for the uploading transaction. In this case, the uploading session may be construed as free. However, cellular networks may impose non-trivial charges for uploading/downloading a file in their networks based on the user's data plans and volume caps. In this case, the uploading session may literally result in a separate charge or may be viewed as having been charged, e.g., based on a monthly charge.

For a paid network, process 500 may continue to block 522 to verify whether the user opted into a cost-centric policy. If the user has opted into a cost-centric policy and the uploading may result in a charge for the user now or later, a decision to compress the file before uploading may be reached at block 542. Otherwise, process 500 may continue either from block 518 or 522 to block 524 for gathering contextual information for the uploading, e.g., the device type, the network bandwidth, the network latency, the file size, the file type, etc.

Next, process 500 may continue to block 526 to look up the predicted total time for uploading the file with or without compression, namely the non-compression time (NCT) and the compression time (CT), from a lookup table, e.g., based on the contextual information. The relationship between NCT and CT may be evaluated at block 528. If the NCT is greater than the CT, then the decision to compress the file may again be made at block 542 because data compression will likely improve the user experience with the shortened uploading time.

However, if compress may prolong the total time for uploading at block 528, it may be further checked whether the present network is a paid network and the user selected a balanced policy at block 532. If the present network may be considered free or the user selected either a cost-centric policy or a performance policy, then the decision may be made at block 544 that no further data compression may be necessary for this uploading session.

If the present network is a paid network and the user selected a balanced policy, then process 500 may continue to block 534 to compute the compression benefit, such as the cost saving factor related to the reduced file size after data compression. Further, at block 536, process 500 may balance the compression benefit against the time loss at block 528, e.g., based on Eq. 1 discussed herein. If the compression benefit surpasses the time loss, process 500 may still proceed to compress the file at block 542; otherwise, process 500 may proceed to upload the file without further compression at block 544.

Figure 6:
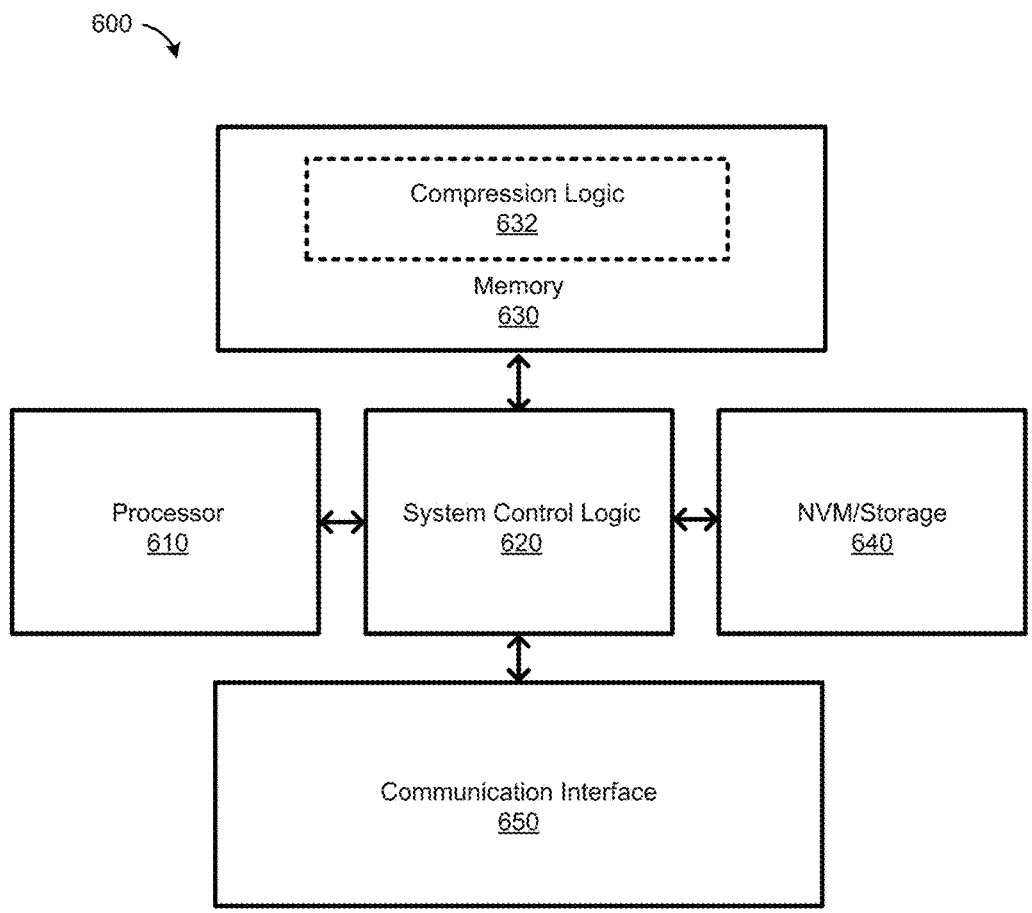
FIG. 6 illustrates an example computing device suitable for practicing the disclosed embodiments, in accordance with various embodiments.

FIG. 6 illustrates an embodiment of a computing device 600 suitable for practicing embodiments of the present disclosure. Computing device 600 may be any computing device that is within a user's reach (e.g., a device that the user carries, wears, touches, gestures, etc.), in forms such as a smartphone, a wearable device, a tablet, a laptop, a desktop, a server, etc. As illustrated, computing device 600 may include system control logic 620 coupled to processor 610, to system memory 630, to non-volatile memory (NVM)/storage 640, and to communication interface 650. In various embodiments, processor 610 may include one or more processor cores.

In various embodiments, communication interface 650 may provide an interface for computing device 600 to communicate with another computing device (e.g., a server) as previously discussed in connection with FIG. 1. In various embodiments, communication interface 650 may provide an interface for computing device 600 to communicate over one or more network(s) and/or with any other suitable device. Communication interface 650 may include any suitable hardware and/or firmware, such as a network adapter, one or more antennas, wireless interface(s), and so forth. In various embodiments, communication interface 650 may include an interface for computing device 600 to use near field communication (NFC), optical communications, or other similar technologies to communicate directly (e.g., without an intermediary) with another device, including sensors. In various embodiments, communication interface 650 may interoperate with radio communications technologies such as, for example, Wideband Code Division Multiple Access (WCDMA), Global System for Mobile Communications (GSM), Long Term Evolution (LTE), Bluetooth®, Zigbee, and the like.

In some embodiments, system control logic 620 may include any suitable interface controllers to provide for any suitable interface to the processor 610 and/or to any suitable device or component in communication with system control logic 620. System control logic 620 may also interoperate with a display (not shown) for display of information, such as to a user. In various embodiments, the display may include one of various display formats and forms, such as, for example, liquid-crystal displays, cathode-ray tube displays, e-ink displays, projection displays. In various embodiments, the display may include a touch screen.

In some embodiments, system control logic 620 may include one or more memory controller(s) (not shown) to provide an interface to system memory 630. System memory 630 may be used to load and store data and/or instructions, for example, for computing device 600. System memory 630 may include any suitable volatile memory, such as dynamic random access memory (DRAM), for example.

In some embodiments, system control logic 620 may include one or more input/output (I/O) controller(s) (not shown) to provide an interface to NVM/storage 640 and communication interface 650. NVM/storage 640 may be used to store data and/or instructions, for example. NVM/storage 640 may include any suitable non-volatile memory, such as flash memory, for example, and/or may include any suitable non-volatile storage device(s), such as one or more hard disk drive(s) (HDD), one or more solid-state drive(s), one or more compact disc (CD) drive(s), and/or one or more digital versatile disc (DVD) drive(s), for example. NVM/storage 640 may include a storage resource that is physically part of a device on which computing device 600 is installed or it may be accessible by, but not necessarily a part of, computing device 600. For example, NVM/storage 640 may be accessed by computing device 600 over a network via communication interface 650.

In various embodiments, system memory 630, NVM/storage 640, and system control logic 620 may include, in particular, temporal and persistent copies of compression logic 632. Compression logic 632 may include instructions that, when executed by processor 610, result in computing device 600 providing adaptive data compression based on user preference and/or other contextual information, such as, but not limited to, process 300, 400, or 500. In various embodiments, compression logic 632 may include instructions that, when executed by processor 610, result in computing device 600 performing various functions associated with context monitoring module 210, policy module 220, analysis module 230, compression module 240, and/or networking module 250, in connection with FIG. 2.

In some embodiments, processor 610 may be packaged together with system control logic 620 and/or compression logic 632. In some embodiments, at least one of the processor(s) 610 may be packaged together with system control logic 620 and/or compression logic 632 to form a System in Package (SiP). In some embodiments, processor 610 may be integrated on the same die with system control logic 620 and/or compression logic 632. In some embodiments, processor 610 may be integrated on the same die with system control logic 620 and/or compression logic 632 to form a System on Chip (SoC).

Depending on which modules of apparatus 200 in connection with FIG. 2 are hosted by computing device 600, the capabilities and/or performance characteristics of processor 610, system memory 630, and so forth, may vary. In various implementations, computing device 600 may be a smartphone, a tablet, a mobile computing device, a wearable computing device, a server, etc., enhanced with the teachings of the present disclosure.

Figure 7:
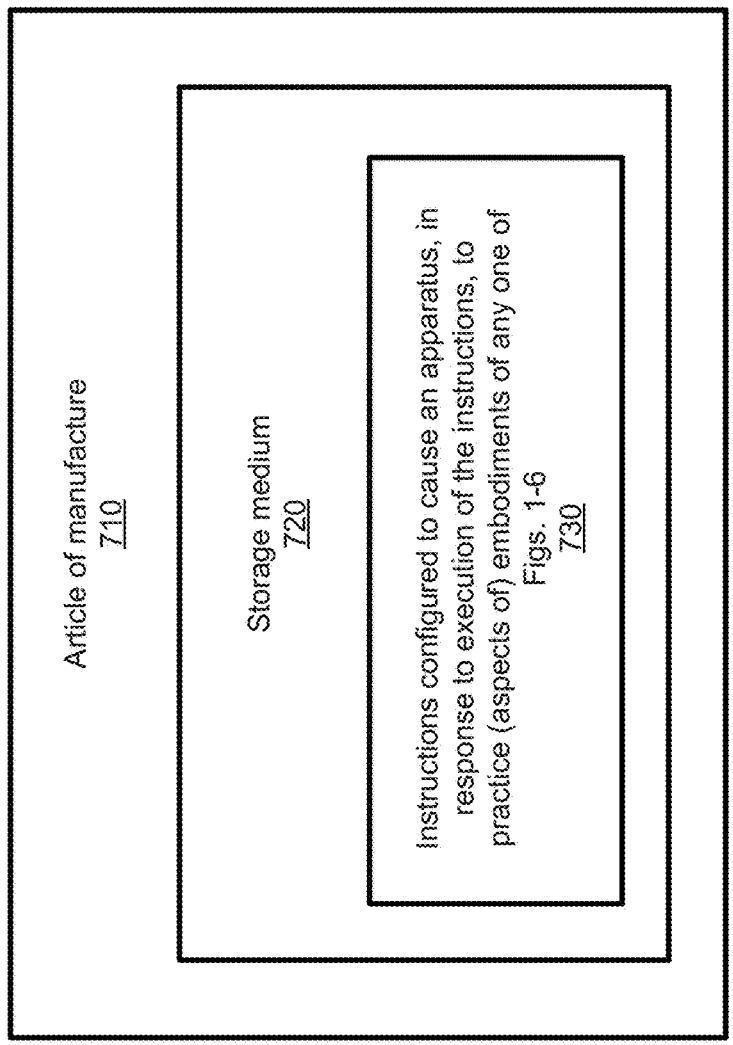
FIG. 7 illustrates an article of manufacture having programming instructions, incorporating aspects of the present disclosure, in accordance with various embodiments.

FIG. 7 illustrates an article of manufacture 710 having programming instructions, incorporating aspects of the present disclosure, in accordance with various embodiments. In various embodiments, an article of manufacture may be employed to implement various embodiments of the present disclosure. As shown, the article of manufacture 710 may include a computer-readable non-transitory storage medium 720 where instructions 730 are configured to practice embodiments of or aspects of embodiments of any one of the processes described herein. The storage medium 720 may represent a broad range of persistent storage media known in the art, including but not limited to flash memory, dynamic random access memory, static random access memory, an optical disk, a magnetic disk, etc. Instructions 730 may enable an apparatus, in response to their execution by the apparatus, to perform various operations described herein. For example, storage medium 720 may include instructions 730 configured to cause an apparatus, e.g., apparatus 200, to practice some or all aspects of adaptive data compression, as illustrated in process 300 of FIG. 3, process 400 of FIG. 4, process 500 of FIG. 5, or aspects of embodiments of any one of the figures disclosed herein. In various embodiments, computer-readable storage medium 720 may include one or more computer-readable non-transitory storage media. In other embodiments, computer-readable storage medium 720 may be transitory, such as signals, encoded with instructions 730.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

The following paragraphs describe examples of various embodiments.

A first kind of examples may include an apparatus for computing, which may include a context monitoring module to gather contextual information for transmission of data; a policy module to gather user preference on cost associated with transmission of data; and an analysis module, coupled to the context monitoring module and the policy module, to determine whether to compress data prior to transmission, based at least in part on the contextual information and the user preference. Another example may include the apparatus of any of the preceding first kind of examples, wherein the analysis module is further to determine a data compression algorithm to compress data prior to transmission, when a determination is made to compress data prior to transmission. Another example may include the apparatus of any of the preceding first kind of examples, further includes a compression module, coupled to the analysis module, to perform the data compression algorithm on data prior to transmission. Another example may include the apparatus of any of the preceding first kind of examples, wherein the context monitoring module is to gather the contextual information of at least one of a device type of the apparatus, a network bandwidth, a network latency, or a data size of data to be transmitted. Another example may include the apparatus of any of the preceding first kind of examples, wherein the policy module is to gather the user preference of at least one of a performance-centric policy, a cost-centric policy, or a policy that balances both performance and cost. Another example may include the apparatus of any of the preceding first kind of examples, wherein the analysis module is to use a configurable coefficient to assign a first weight to a time saving factor and a second weight to a traffic saving factor in the policy that balances both performance and cost. Another example may include the apparatus of any of the preceding first kind of examples, wherein the analysis module is further to look up a first total time for transmission of compressed data and a second total time for transmission of uncompressed data from a lookup table based on the contextual information. Another example may include the apparatus of any of the preceding first kind of examples, wherein the analysis module is further to construct the lookup table offline using a machine learning process based on a plurality of impact factors of the contextual information and a plurality of training datasets. Another example may include the apparatus of any of the preceding first kind of examples, wherein the analysis module is further to estimate a first total time for transmission of compressed data and a second total time for transmission of uncompressed data, using a plurality of impact factors of the contextual information in a random forest regression machine learning process. Another example may include the apparatus of any of the preceding first kind of examples, wherein the data comprises a compressible file, and wherein the analysis module is to make a determination of whether to compress the compressible file prior to transmission of the compressible file to a server through at least one wireless network.

A second kind of examples may include a method for computing, comprising: receiving, by a computing device, an indication for transmitting a file to a server; gathering, by the computing device, a plurality of impact factors on a duration for transmitting the file to the server and a user preference for performance or cost for transmitting the file to the server; and determining, by the computing device, whether to compress the file before transmitting the file to the server based at least in part on the plurality of impact factors and the user preference. Another example may include the method of any of the preceding second kind of examples, further comprising selecting, by the computing device, a data compression algorithm for compressing the file; and performing, by the computing device, the data compression algorithm on the file before transmitting the file to the server. Another example may include the method of any of the preceding second kind of examples, wherein the gathering comprises gathering at least one of a device type of the computing device, a network bandwidth between the computing device and the server, a network latency between the computing device and the server, or a file size of the file. Another example may include the method of any of the preceding second kind of examples, wherein the gathering comprises gathering at least one of a performance-centric policy, a cost-centric policy, or a policy that balances both performance and cost preferred by the user of the computing device. Another example may include the method of any of the preceding second kind of examples, wherein the determining comprises determining whether compressing the file before transmitting the file shortens a total time for transmitting the file to the server under the performance-centric policy. Another example may include the method of any of the preceding second kind of examples, wherein the determining comprises determining whether compressing the file before transmitting the file saves a monetary cost for a user of the computing device to transmit the file to the server under the cost-centric policy. Another example may include the method of any of the preceding second kind of examples, wherein the determining comprises assigning a first weight to a time saving factor and a second weight to a traffic saving factor under the balanced policy. Another example may include the method of any of the preceding second kind of examples, wherein the determining comprises determining whether to compress the file before transmitting the file to the server based at least in part on the user preference for reducing a total time for transmitting the file or a total monetary cost for transmitting the file. Another example may include the method of any of the preceding second kind of examples, wherein the determining comprises looking up a first total time with compression for transmitting the file and a second total time without compression for transmitting the file from a lookup table. Another example may include the method of any of the preceding second kind of examples, constructing, by the computing device, the lookup table using a machine learning process based on the plurality of impact factors.

Another example may include an apparatus comprising means to perform any of the preceding second kind of examples. Another example may include one or more non-transitory computer readable media comprising instructions to cause an apparatus, upon execution of the instructions by one or more processors of the apparatus, to perform any of the preceding second kind of examples.

A third kind of examples may include a method for computer networking. The method may include receiving, by a module operating on a client or a sever, an indication from the client for transmitting a file to the server; gathering, by the module, a plurality of impact factors on a duration for transmitting the file from the client to the server and a user preference for performance or cost for transmitting the file from the client to the server; determining, by the module, whether the client is to compress the file before transmitting the file from the client to the server based at least in part on the plurality of impact factors and the user preference; and sending to the client, by the module, a result of the determination of whether the client is to compress the file before transmitting the file from the client to the server. Another example may include the method of any of the preceding third kind of examples, wherein the gathering comprises gathering at least one of a device type of the client, a network bandwidth between the client and the server, a network latency between the client and the server, or a file size of the file. Another example may include the method of any of the preceding third kind of examples, wherein the gathering comprises gathering at least one of a performance-centric policy, a cost-centric policy, or a policy that balances performance and cost preferred by the user of the computing device to reduce a total time for transmitting the file or a total monetary cost for transmitting the file. Another example may include the method of any of the preceding third kind of examples, wherein the determining comprises looking up a first total time with compression for transmitting the file and a second total time without compression for transmitting the file from a lookup table constructed using a machine learning process based on the plurality of impact factors. Another example may include the method of any of the preceding third kind of examples, wherein the module is located in the server.

Another example may include an apparatus comprising means to perform any of the preceding third kind of examples. Another example may include one or more non-transitory computer readable media comprising instructions to cause an apparatus, upon execution of the instructions by one or more processors of the apparatus, to perform any of the preceding third kind of examples.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A non-transitory computer readable medium containing instructions to cause a networking apparatus, in response to execution of the instructions by a processor of the apparatus, to:
    gather current contextual information for transmission of data;
    gather user preference on cost associated with transmission of data; and
    determine whether to compress data prior to transmission, based at least in part on the current contextual information and the user preference, wherein to determine includes to look up a first total time for transmission of compressed data and a second total time for transmission of uncompressed data from a lookup table, the lookup table previously built using a random forest regression machine learning process based on previously gathered contextual information, and
    wherein the user preference comprises one of a performance-centric policy that prioritizes reduced transmission time, a cost-centric policy that prioritizes reduced data usage, or a balanced policy that weighs transmission time and data usage where at least one weight is configurable.

2. The computer readable medium of claim 1, wherein the networking apparatus is further caused to determine a data compression algorithm to compress data prior to transmission, when a determination is made to compress data prior to transmission.

3. The computer readable medium of claim 2, wherein the networking apparatus is further caused to:
    perform the data compression algorithm on data prior to transmission.

4. The computer readable medium of claim 1, wherein the networking apparatus is further caused to gather the contextual information of at least one of a device type of the apparatus, a network bandwidth, a network latency, or a data size of data to be transmitted.

5. The computer readable medium of claim 1, wherein the networking apparatus is further caused to use a configurable coefficient to assign a first weight to a time saving factor and a second weight to a traffic saving factor in the policy that balances both performance and cost.

6. The computer readable medium of claim 1, wherein the networking apparatus is further caused to construct the lookup table offline using a machine learning process based on a plurality of impact factors of the previously gathered contextual information and a plurality of training datasets.

7. The computer readable medium of claim 1, wherein the networking apparatus is further caused to estimate a first total time for transmission of compressed data and a second total time for transmission of uncompressed data, using a plurality of impact factors of the contextual information in a random forest regression machine learning process.

8. The computer readable medium of claim 1, wherein the data comprises a compressible file, and wherein the apparatus is further caused to make a determination of whether to compress the compressible file prior to transmission of the compressible file to a server through at least one wireless network.

9. A method for computer networking, comprising:
    receiving, by a computing device, an indication for transmitting a file to a server;
    gathering, by the computing device, a plurality of current impact factors on a duration for transmitting the file to the server and a user preference for performance or cost for transmitting the file to the server; and
    determining, by the computing device, whether to compress the file before transmitting the file to the server based at least in part on the plurality of current impact factors and the user preference, the determining including looking up a first total time with compression for transmitting the file and a second total time without compression for transmitting the file from a lookup table, the lookup table previously built using a random forest regression machine learning process based on at least one of a plurality of previously gathered impact factors, and
    wherein the user preference comprises one of a performance-centric policy that prioritizes reduced transmission time, a cost-centric policy that prioritizes reduced data usage, or a balanced policy that weighs transmission time and data usage where at least one weight is configurable.

10. The method of claim 9, further comprising:
    selecting, by the computing device, a data compression algorithm for compressing the file; and
    performing, by the computing device, the data compression algorithm on the file before transmitting the file to the server.

11. The method of claim 9, wherein the gathering comprises gathering at least one of a device type of the computing device, a network bandwidth between the computing device and the server, a network latency between the computing device and the server, or a file size of the file.

12. The method of claim 9, wherein the determining comprises determining whether compressing the file before transmitting the file shortens a total time for transmitting the file to the server under the performance-centric policy.

13. The method of claim 9, wherein the determining comprises determining whether compressing the file before transmitting the file saves a monetary cost for a user of the computing device to transmit the file to the server under the cost-centric policy.

14. The method of claim 9, wherein the determining comprises assigning a first weight to a time saving factor and a second weight to a traffic saving factor under the balanced policy.

15. The method of claim 9, wherein the determining comprises determining whether to compress the file before transmitting the file to the server based at least in part on the user preference for reducing a total time for transmitting the file or a total monetary cost for transmitting the file.

16. The method of claim 9, further comprising:
constructing, by the computing device, the lookup table using a machine learning process based on the plurality of previously gathered impact factors.

17. A method for computer networking, comprising:
receiving, by a module operating on a client or a server, an indication from the client for transmitting a file to the server;
gathering, by the module, a plurality of current impact factors on a duration for transmitting the file from the client to the server and a user preference for performance or cost for transmitting the file from the client to the server;
determining, by the module, whether the client is to compress the file before transmitting the file from the client to the server based at least in part on the plurality of current impact factors and the user preference, the determining comprising looking up a first total time with compression for transmitting the file and a second total time without compression for transmitting the file from a lookup table previously constructed using a random forest regression machine learning process, the machine learning process to construct the lookup table based on a plurality of previously gathered impact factors; and
sending to the client, by the module, a result of the determination of whether the client is to compress the file before transmitting the file from the client to the server, and
wherein the user preference comprises one of a performance-centric policy that prioritizes reduced transmission time, a cost-centric policy that prioritizes reduced data usage, or a balanced policy that weighs transmission time and data usage where at least one weight is configurable.

18. The method of claim 17, wherein the gathering comprises gathering at least one of a device type of the client, a network bandwidth between the client and the server, a network latency between the client and the server, or a file size of the file.

19. The computer readable medium of claim 1, wherein the lookup table is built offline using a training dataset.

20. The method of claim 9, wherein the lookup table is built offline using a training dataset.

21. The method of claim 17, wherein the lookup table is built offline using a training dataset.

* * * * *